US009577757B2

(12) United States Patent
Oomori

(10) Patent No.: US 9,577,757 B2
(45) Date of Patent: Feb. 21, 2017

(54) OPTICAL TRANSMITTER

(71) Applicant: SUMITOMO ELECTRIC INDUSTRIES, LTD., Osaka (JP)

(72) Inventor: Hirotaka Oomori, Yokohama (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 74 days.

(21) Appl. No.: 14/562,047

(22) Filed: Dec. 5, 2014

(65) Prior Publication Data
US 2015/0162989 A1 Jun. 11, 2015

(30) Foreign Application Priority Data
Dec. 5, 2013 (JP) ................. 2013-252237

(51) Int. Cl.
H01S 3/04 (2006.01)
H01S 5/00 (2006.01)
H04B 10/40 (2013.01)
H04B 10/50 (2013.01)
H01S 3/067 (2006.01)
H01S 5/022 (2006.01)
H01S 5/06 (2006.01)
H01S 5/026 (2006.01)

(52) U.S. Cl.
CPC ............ *H04B 10/40* (2013.01); *H01S 3/0405* (2013.01); *H01S 3/06704* (2013.01); *H01S 5/02276* (2013.01); *H04B 10/50* (2013.01); *H04B 10/503* (2013.01); *H04B 10/506* (2013.01); H01S 5/0261 (2013.01); H01S 5/0617 (2013.01)

(58) Field of Classification Search
CPC ..... H04B 10/40; H04B 10/506; H04B 10/503; H04B 10/50; H01S 5/02276; H01S 3/06704; H01S 3/0405; H01S 5/0261; H01S 5/0617
See application file for complete search history.

(56) References Cited

U.S. PATENT DOCUMENTS

| 2004/0067060 | A1* | 4/2004 | Aronson | H04B 10/50 398/135 |
| 2004/0161248 | A1* | 8/2004 | Stewart | H04B 10/572 398/196 |
| 2008/0131139 | A1* | 6/2008 | Ishibashi | H04B 10/40 398/155 |

(Continued)

FOREIGN PATENT DOCUMENTS

JP 2008-113207 5/2008

*Primary Examiner* — Yuanda Zhang
(74) *Attorney, Agent, or Firm* — Smith, Gambrell & Russell, LLP.

(57) ABSTRACT

An optical transmitting unit comprises an integrated optical transmitter module including an LD, a TEC configured to heat or cool the LD, a thermal sensor configured to sense a temperature of the LD, and a package configured to house the LD, the thermal sensor, and the TEC, an MCU, and a temperature detection circuit configured to detect a temperature outside the package. The thermal sensor is thermally coupled with the TEC and is also thermally coupled with the outside of the package, and the MCU defines data output from the temperature detection circuit as an internal temperature when the LD is being energized, and estimates the data of internal temperature on the basis of the temperature detected with the thermal sensor and the data when the LD is not being energized.

17 Claims, 10 Drawing Sheets

(56) References Cited

U.S. PATENT DOCUMENTS

| | | | | |
|---|---|---|---|---|
| 2008/0310851 A1* | 12/2008 | Ichino | ............... | H04B 10/40 398/135 |
| 2012/0205526 A1* | 8/2012 | Iwanaga | ............ | H04B 10/40 250/227.11 |
| 2013/0148975 A1* | 6/2013 | Kwon | ............... | H04B 10/506 398/116 |

* cited by examiner

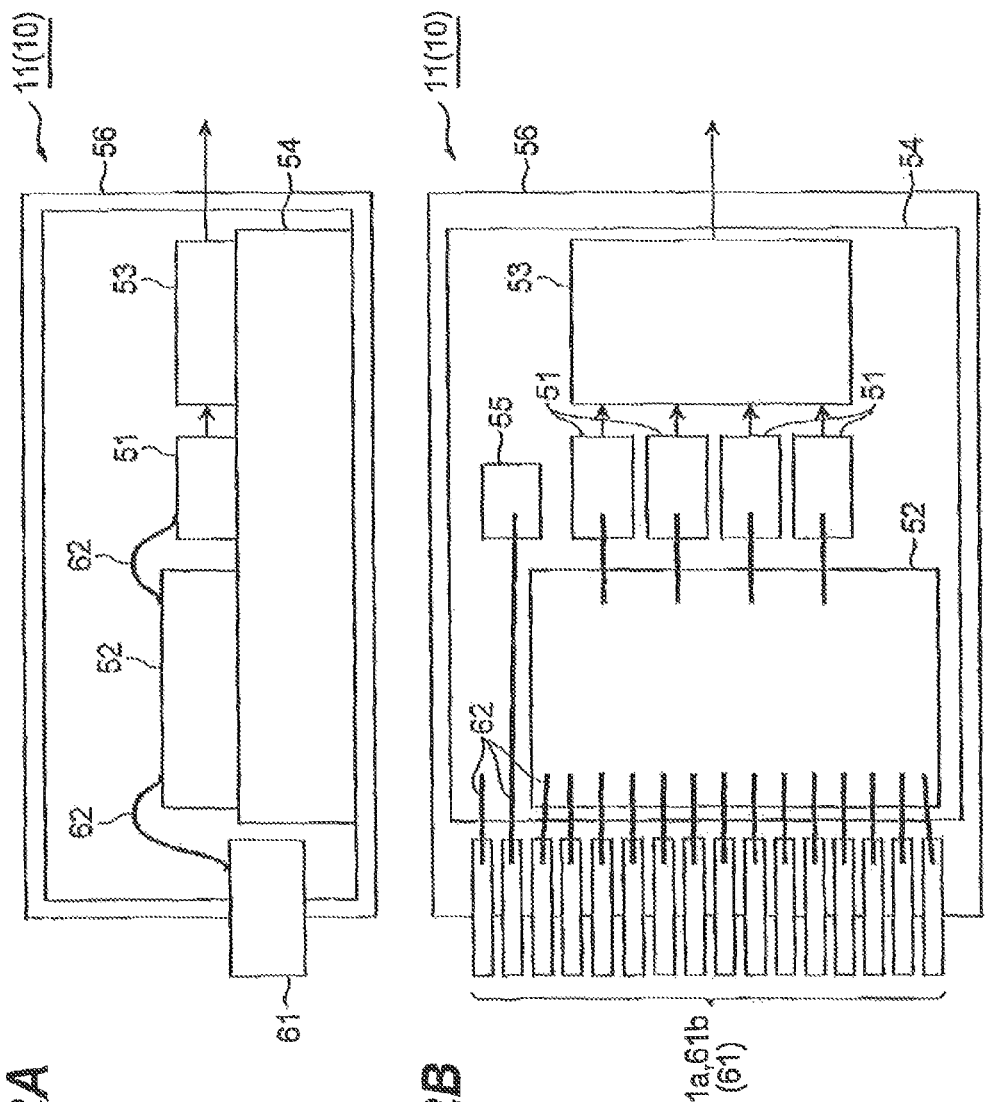

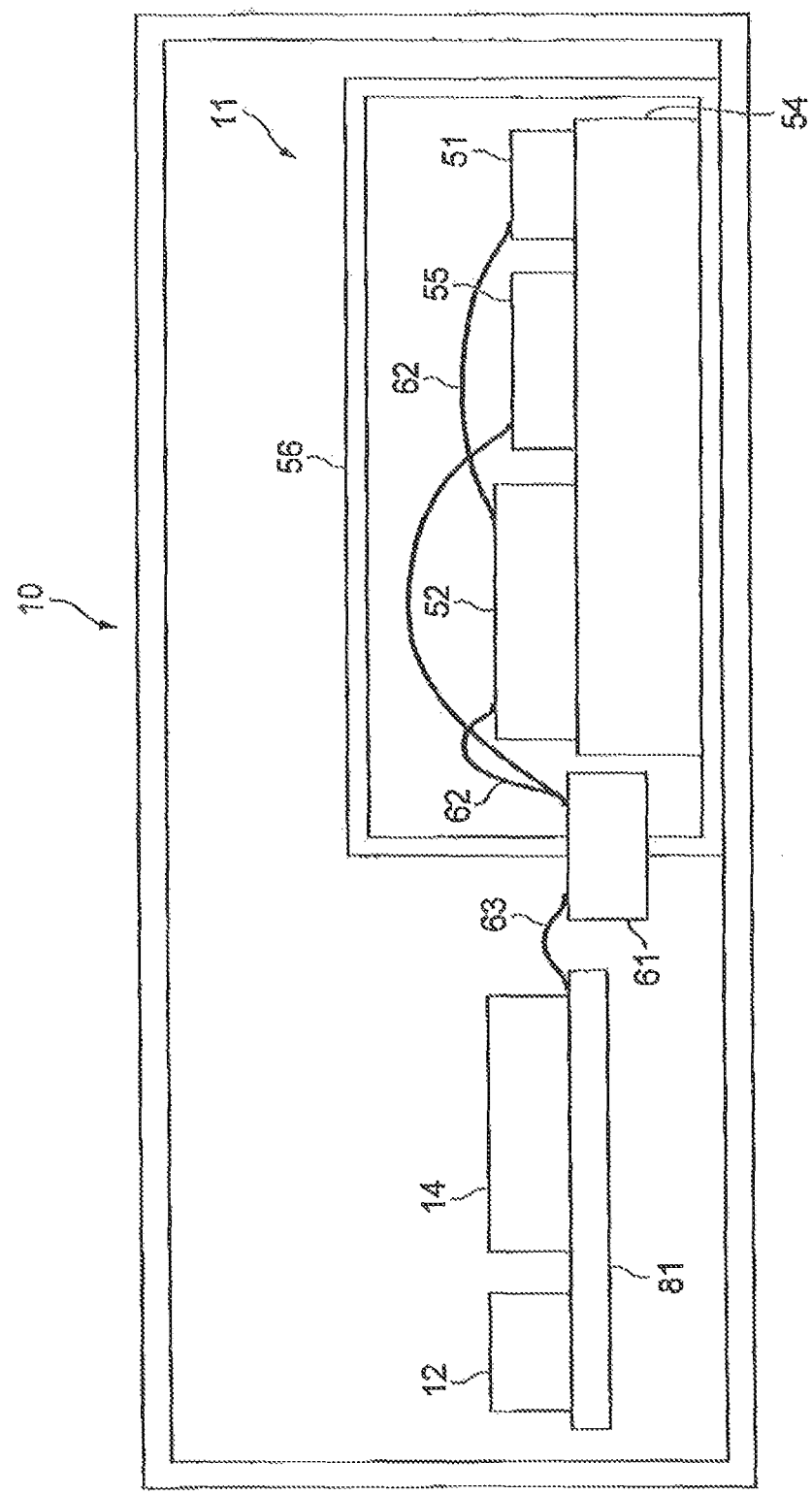

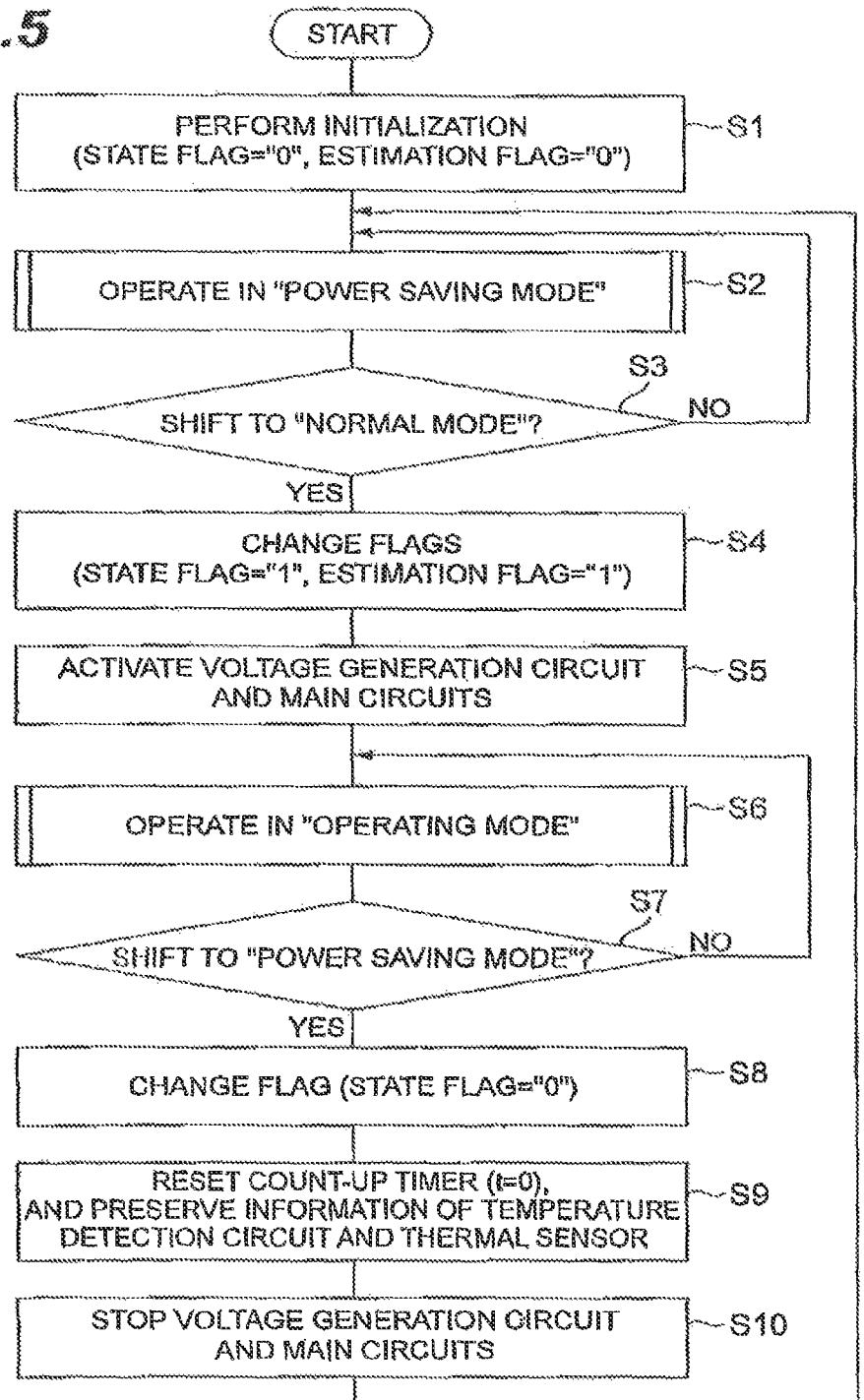

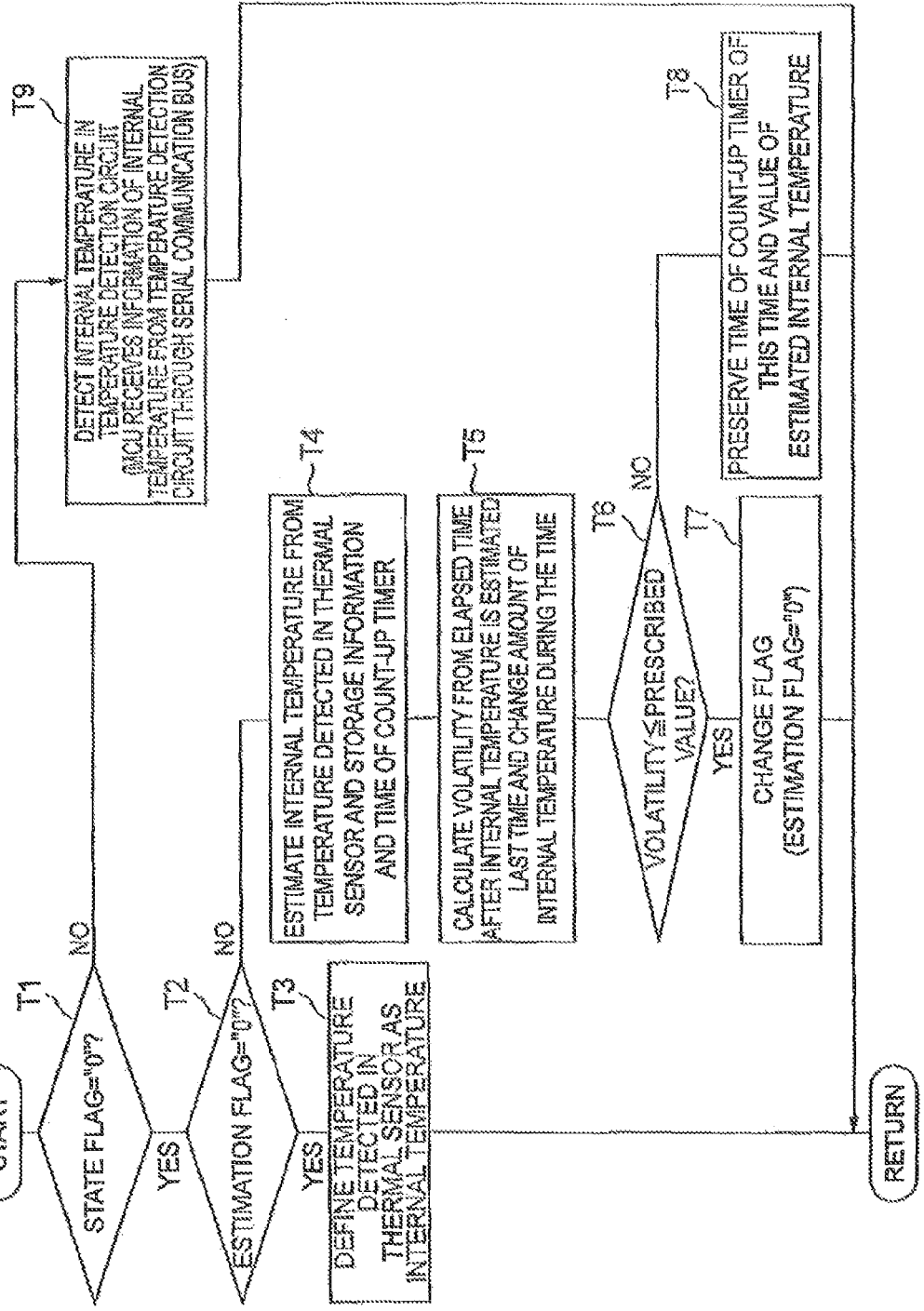

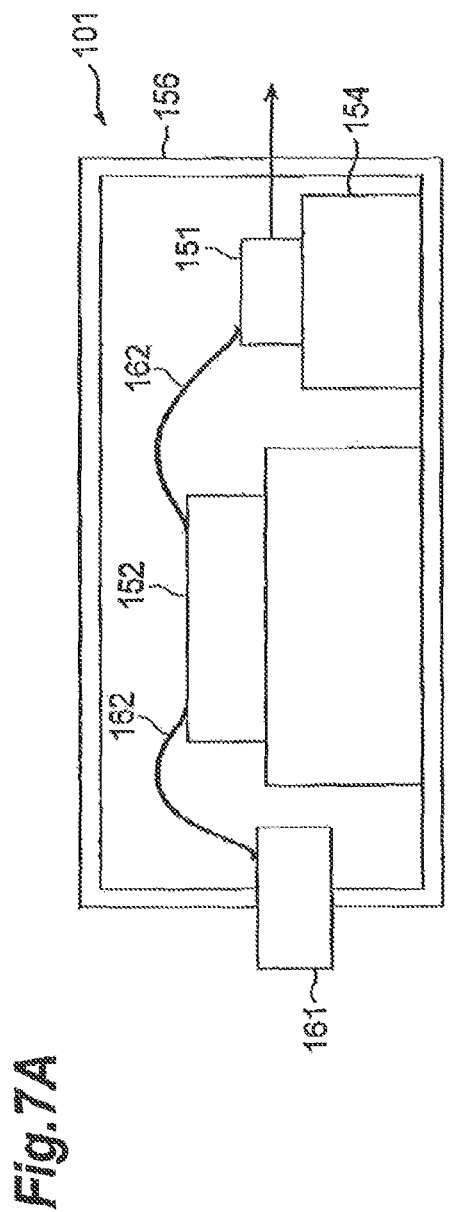
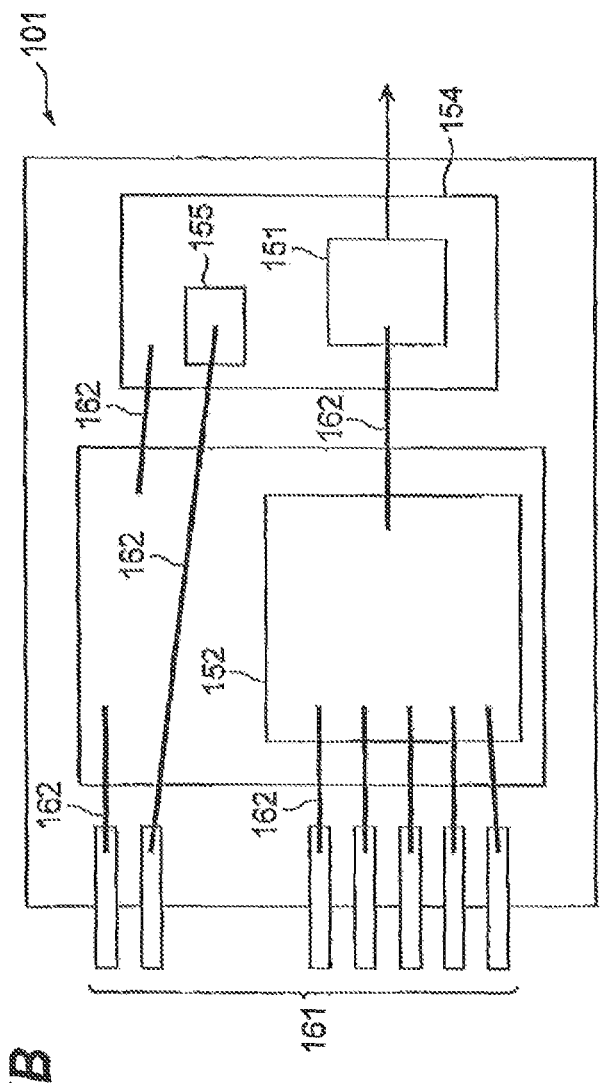
Fig. 7A
Fig. 7B

OPTICAL TRANSMITTER

BACKGROUND OF THE INVENTION

Field of the Invention

The present invention relates to an optical transmitter.

Related Background of the Invention

Recently, for speed-up and capacity increase of a communication network, miniaturization and power consumption reduction of an optical transceiver (including both optical transmitter and optical receiver) have been continuously demanded from an optical communication system market. For example, as a 100-gigabit optical transceiver, CFP (100G Form-factor Pluggable) products have started to spread in the market. Also, lately, study of industrial standards called MSA (Multi Source Agreement) such as CFP2 and CFP4 of the next generation is underway for further miniaturization by a factor of one half and one quarter from the CFP.

When miniaturizing (highly integrating) an optical transceiver, it is preferable that internal components and an IC can be connected through a serial communication bus with a small number of signal lines. For example, in Patent Literature 1, plurality of internal components like a PHY (Physical Layer Chip) to communicate in a physical layer by electric signals, a CPU (Central Processing Unit) to monitor and control inside of the optical transceiver, a memory and so on, are interconnected through an internal serial communication bus. For the optical transceivers such as the CFP products, for example, two optical transceivers are connected to each other through a duplex optical fiber for bidirectional communication by optical signals. Therefore, an optical transmitter (optical transmitting unit) to convert an electric signals to an optical signal and transmit the converted optical signal outward and an optical receiver (optical reception unit) to receive an optical signal and convert the received optical signal to an electric signal are included in an optical transceiver.

Patent Literature 1: Japanese Patent Application Laid-Open Publication No. 2008-113207

The optical transmitter described above has two modes, one of which is a power saving mode for suppressing the entire power consumption as much as possible, practically less than a value specified in the MSA standard, and another of which is an operating mode for normally transmitting an optical signal. For example, for the CFP products, the power consumption should be smaller than 1 W for the power saving mode, but may be larger than 8 W for the operating mode. In the power saving mode, it is needed to run only the minimum parts such as an MCU (Micro Controller Unit) including a communication circuit with an external device (host system) of an upper layer and an arithmetic processing circuit, and to shut off an internal power supply to the other components such as a signal processing circuit for transmission and reception of optical signals. At the time, when the internal power supply for the other components is stopped and one of terminals of a component connected to the serial communication bus is pulled down to Low level of logic signal levels, the communication among all the components connected through the serial communication bus becomes unavailable because the serial communication bus is stuck An optical transmitter is required to monitor a temperature inside the optical transceiver and answer the monitored temperature to the host system for monitoring and control in the upper layer. Hereinafter, the temperature inside the optical transceiver is called "internal temperature". The internal temperature corresponds to an environmental temperature common for a plurality of internal components, and is different from a temperature inside a specific component (for example, an optical transmitter module). As a method of monitoring the internal temperature, an analog circuit to monitor resistance of a thermistor, which changes with the temperature, is used. Also, as another method, a prescribed component with a temperature detection circuit, which detects the temperature and outputs data of the detected temperature through the serial communication bus is used.

However, the analog circuit needs a large mounting area because a lot of electrical parts are included. Therefore, from a viewpoint of the miniaturization of the optical transceiver, the method of using the prescribed component and communicating with it through the serial communication bus is preferable because the prescribed component is available as an IC with a small package. However, as described above, since the serial communication bus is stuck in the power saving mode, it becomes difficult to monitor the internal temperature through the serial communication bus.

SUMMARY OF THE INVENTION

The present invention is related to the optical transmitter having a function of answering internal temperature to an external device as one aspect thereof. The optical transmitter comprises an optical transmitter module, an arithmetic processing circuit which controls the energization of the active element, a storage device which stores data accessible from the arithmetic processing circuit, and a temperature detection circuit which detects the internal temperature and outputs data of the internal temperature. The optical transmitter module includes at least one active element which generates heat by energization, a thermoelectric element which heats or cools the active element, a thermal sensor which senses a temperature of the active element, and a package which houses the active element, the thermal sensor, and the thermoelectric element, The active element is thermally coupled with the outside of the package through a plurality of electric wires connected with a plurality of terminals of the package. The arithmetic processing circuit stores the data output from the temperature detection circuit to the storage device as the internal temperature when the active element is being energized, and calculates data of the internal temperature on the basis of both the temperature detected with the thermal sensor and the data stored in the storage device and stores the calculated data to the storage device as the internal temperature when the active element is not being energized.

BRIEF DESCRIPTION OF THE DRAWINGS

The present invention will now be described by way of example only and not in any limitative sense with reference to the accompanying drawings in which:

FIG. 2A is a diagram for illustrating an electrical interconnection state inside an integrated optical transmitter module;

FIG. 2B is a diagram for illustrating an electrical interconnection state inside an integrated optical transmitter module;

FIG. 3 is a diagram for illustrating an electrical interconnection state of an optical transmitting unit;

FIG. 5 is a flowchart for illustrating the individual operation modes of the optical transceiver after activation and processing related to temperature estimation;

FIG. 6 is a flowchart for illustrating processing related to calculation of the internal temperature;

FIG. 7A is a diagram for illustrating an electrical interconnection state inside an optical transmitter module according to a comparative example;

FIG. 7B is a diagram for illustrating an electrical interconnection state inside an optical transmitter module according to a comparative example;

DESCRIPTION OF THE PREFERRED EMBODIMENTS

Figure 1:
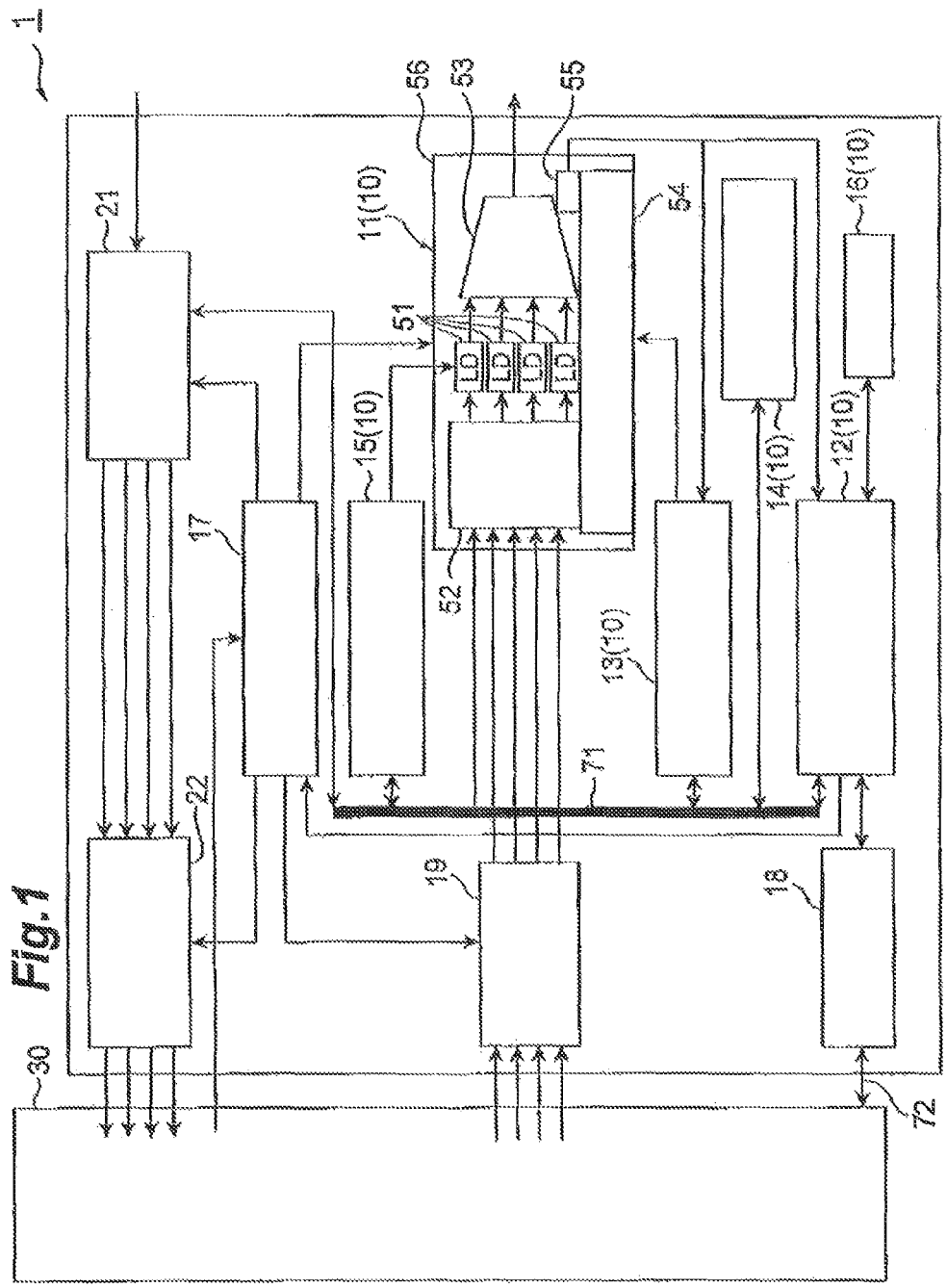
FIG. 1 is a block diagram illustrating a configuration of an optical transceiver according to the present embodiment.

Descriptions of Embodiment of the Claimed Invention

First, contents of an embodiment of the claimed invention will be listed and described.

One aspect of the present invention is related to the optical transmitter having a function of answering internal temperature to an external device. The optical transmitter comprises an optical transmitter module, an arithmetic processing circuit which controls the energization of the active element, a storage device which stores data accessible from the arithmetic processing circuit, and a temperature detection circuit which detects the internal temperature and outputs data of the internal temperature. The optical transmitter module includes at least one active element which generates heat by energization, a thermoelectric element which heats or cools the active element, a thermal sensor which senses a temperature of the active element, and a package which houses the active element, the thermal sensor, and the thermoelectric element, The active element is thermally coupled with the outside of the package through a plurality of electric wires connected with a plurality of terminals of the package. The arithmetic processing circuit stores the data output from the temperature detection circuit to the storage device as the internal temperature when the active element is being energized, and calculates data of the internal temperature on the basis of both the temperature detected with the thermal sensor and the data stored in the storage device and stores the calculated data to the storage device as the internal temperature when the active element is not being energized.

In the optical transmitter, a method to derive the internal temperature of the optical transmitter is changed depending on whether a target element of temperature control (called an "active element", hereinafter), is being energized or not. The active element is thermally coupled with an upper surface of the thermoelectric element. That is, when the active element is being energized, the temperature detected by the temperature detection circuit provided on the outside of the package of the optical transmitter module (and in the inside of the optical transmitter) is defined as the internal temperature of the optical transmitter. In this way, when the temperature of the active element generating the heat by the energization is controlled so as to be a prescribed temperature by cooling or heating of the upper surface of the thermoelectric element, the internal temperature of the optical transmitter can be appropriately derived by the temperature detection circuit provided on the outside of the optical transmitter module. On the other hand, when the active element is not being energized, the internal temperature of the optical transmitter is calculated on the basis of both the temperature detected with the thermal sensor and the data stored in the storage device. In the case that components of the arithmetic processing circuit and the temperature detection circuit or the like are connected through a serial communication bus, even when serial communication between the arithmetic processing circuit and the temperature detection circuit is stuck, the internal temperature of the optical transmitter can be surely and accurately derived by calculating the internal temperature on the basis of the temperature detected with the thermal sensor. Since the active element, temperature of which is detected by the thermal sensor, is thermally coupled with the outside of the package of the optical transmitter module, when the active element does not generate the heat under no energization and the temperature of the active element is not thermally controlled, the temperature detected with the thermal sensor becomes a value corresponding to the temperature outside the package of the optical transmitter module. Therefore, the calculation of the internal temperature of the optical transmitter based on the temperature detected with the thermal sensor described above is enabled. Also, the optical transmitter utilizes the thermal sensor, the purpose of which is originally for detecting the temperature of the active element in the operating mode, also for calculating the internal temperature of the optical transmitter in the power saving mode. Accordingly, a new component is not added to monitor the internal temperature of the optical transmitter. Therefore, miniaturization of the optical transmitter is not adversely affected. From the above, according to the aspect, the internal temperature can be surely and appropriately monitored regardless of the operation state while miniaturizing the optical transmitter.

Also, in the above-described optical transmitter, when thermal resistance between the active element and the temperature detection circuit is defined as RTOSA, thermal resistance between the temperature detection circuit and an outer side surface of the optical transmitter is defined as RTRX, thermal capacity to be heated and cooled by the thermoelectric element is defined as CTOSA, and thermal capacity inside the optical transmitter is defined as CTRX, a configuration may be such that

[formula 1]

$$\frac{1}{RTOSA \times CTOSA} > \frac{1}{RTRX \times CTRX} \qquad (1)$$

is satisfied. By satisfying the formula (1), a change of the internal temperature of the optical transmitter becomes more gradual than a change of the temperature detected by the thermal sensor, and the internal temperature of the optical transmitter on the outside of the optical transmitter module can be highly accurately estimated from the temperature detected by the thermal sensor provided inside the optical transmitter module.

Also, in the above-described optical transmitter, the optical transmitter module may include at least two light emitting elements and at least one drive circuit configured to drive the light emitting elements, as the active element, and the light emitting elements and the drive circuit may be thermally coupled with the outside of the package through a plurality of electric wires connected with a plurality of terminals of the package, respectively. For example, like a CFP4, the plurality of light emitting elements and the drive circuit are built inside the optical transmitter module, they are thermally coupled with the plurality of terminals through the electric wires like bonding wires, and thus a thermal conductivity between the active element, temperature of which is detected by the thermal sensor housed inside the package, and the outside of the package increases. Therefore, estimation accuracy of the internal temperature of the optical transmitter based on the temperature detected by the thermal sensor can be improved.

Also, in the above-described optical transmitter, the thermal sensor may be electrically connected with the arithmetic processing circuit, and the arithmetic processing circuit, when calculating data of the internal temperature on the basis of the temperature detected with the thermal sensor when the active element is not being energized, may utilize the temperature detected by the temperature detection circuit immediately before stopping the energization of the active element. By using the data output by the temperature detection circuit when the active element is being energized immediately before, and calculating data of the internal temperature as an initial value for example, the internal temperature can be highly accurately estimated when an energization state (in the operating mode) is shifted to a non-energization state (in the power saving mode).

Details of Embodiment of the Claimed Invention

Specific examples of the optical transmitter according to the embodiment of the present invention will be described with reference to the drawings hereinafter. Also, the present invention is not limited to these examples, but is indicated by the scope of the claims and is intended to include meanings equal to the scope of the claims and all changes within the scope.

FIG. 1 is a diagram illustrating a configuration of an optical transceiver according to a first embodiment. An optical transceiver 1 is a 100-gigabit optical transceiver which transmits and receives optical signals in duplex directions using four optical beams with mutually different respective wavelengths in 1300 nm band for example, and is a module capable of hot plug to an external device 30 (host system in a upper layer). Standards related to an outer shape, terminal arrangement, an electrical characteristic, and an optical characteristic related to such an optical transceiver are being defined by a CFP (100G Form-factor Pluggable) of an MSA (Multi-Source Agreement) standard, or a CFP2, a CFP4 or the like, for example. The CFP2 has a size of about ½ of a conventional CFP by an area ratio on a face perpendicular to the insertion direction, and the CFP4 has a size of ¼ of the conventional CFP or smaller by the area ratio.

The optical transceiver 1 includes an integrated optical transmitter module 11 (optical transmitter module), an arithmetic processing circuit (MCU) 12, a thermoelectric element control circuit (TEC control circuit) 13, a temperature detection circuit 14, an LD bias current circuit 15, a storage device (memory) 16, a voltage generation circuit (internal power supply) 17, a communication control circuit 18, signal processing circuits (CDRs) 19 and 22, and an integrated optical receiver module 21.

The integrated optical transmitter module 11 converts four electric signals of a data rate 25 Gbps that are independent of each other to four optical signals with mutually different wavelengths, then multiplexes the respective optical signals, and outputs a 100 Gbps optical signal as a wavelength multiplexed signals. The electric signals inputted to the integrated optical transmitter module 11 are the ones for which 10 lines of 10 Gbps electric signals are converted to four lines of 25 Gbps electric signals in a signal processing IC (not shown in the figure) and then subjected to clock data recovery in the CDR (Clock Data Recovery) 19.

The integrated optical receiver module 21 receives the 100 Gbps optical signal as one wavelength multiplexed signal, demultiplexes the received signal into the four optical signals with mutually different wavelengths, converts the individual optical signals to the electric signals of the data rate 25 Gbps respectively, and outputs them. The four 25 Gbps electric signals outputted by the integrated optical receiver module 21 are inputted to the CDR 22, subjected to the clock data recovery in the CDR 22, and then converted to 10 lines of the 10 Gbps electric signals by the signal processing IC (not shown in the figure) and outputted.

An optical transmitting unit 10 (optical transmitter) is configured by the integrated optical transmitter module 11, the MCU 12, the TEC control circuit 13, the temperature detection circuit 14, and the LD bias current circuit 15, among the above-described components. The optical transmitting unit 10 has a function of answering the internal temperature to the external device. First, the individual components of the optical transmitting unit 10 will be described in detail.

The integrated optical transmitter module 11 includes four LDs 51 (light emitting elements) of mutually different oscillation wavelengths, an LD driver circuit 52 (drive circuit), an optical multiplexer 53, a thermoelectric element (TEC) 54, thermal sensor (thermistor) 55 (first thermal sensor), and a package 56. The four LDs 51, the LD driver circuit 52, the optical multiplexer 53, and the thermal sensor 55 are mounted on an upper surface of the thermoelectric element 54, and they are housed inside one package 56. The optical transmitter module of such a configuration and structure is called an integrated TOSA (Transmitter Optical Sub-Assembly). Also, the four LDs 51 may be respectively independent semiconductor chips or manufactured on the same semiconductor chip. Also, while the oscillation wavelengths of the LDs 51 are different for use of wavelength multiplex communication system, the oscillation wavelengths of the LDs 51 may be the same for use of parallel communication of performing communication in 4-core optical fibers respectively on a transmission side and a reception side, for example.

The LD (Laser Diode) 51 is, for example, a distributed feedback laser diode, a Fabry-Perot laser diode, a surface emitting laser diode (VCSEL), or the like. Each LD 51 is connected to the LD bias current circuit 15. The LD 51 emits beam when a bias current is supplied from the LD bias current circuit 15, and light emission is stopped when the bias current is interrupted. The LD bias current circuit 15 controls the bias current according to an enable signal of LD bias current circuit inputted from the MCU 12. Also, in FIG. 1, the individual LDs 51 are described as being laminated on the TEC 54 in order to facilitate descriptions, however, all the LDs 51 are actually mounted on the TEC 54 as illustrated in FIG. 2. Therefore, all the LDs 51 are well thermally coupled with the upper surface (temperature control surface)

of the TEC 54. The LD 51 is one example of the active element that generates the heat by the energization.

The LD driver circuit 52 controls a drive signal for modulating output beam of the LDs 51 according to an Enable signal of LD driver circuit inputted from the MCU 12. The LD driver circuit 52 is a 4ch Driver IC incorporating four drive circuits which drive the four LDs 51 of the mutually different oscillation wavelengths in parallel, and the individual drive circuits are connected to the respectively different LDs 51. Therefore, four lines of drive signals outputted by the LD driver circuit 52 are inputted to the four respectively different LDs 51. The four lines of drive signals inputted to the respectively different LDs 51 are controlled by the Enable signal of LD driver circuit. The four lines of drive signals are controlled so as to be outputted when the enable signal of LD driver circuit is at a high level, for example, and are controlled so as to be interrupted when the Enable signal of LD driver circuit is at a Low level. In the LD driver circuit 52, in order to reduce a power supply current consumed by itself when interrupting the drive signal by the Enable signal of LD driver circuit rather than when outputting the drive signal, it is preferable to suppress the power supply current close to zero. Also, from the viewpoints of miniaturization and easiness of manufacturing, the LD driver circuit 52 is mounted on the TEC 54. Therefore, the LD driver circuit 52 is thermally coupled with the TEC 54. The LD driver circuit 52 consumes power of several W when driving the LDs 51 at 25 Gbps which is a high-speed data rate, for example.

The optical multiplexer 53 multiplexes the output beam outputted from the four LDs 51 and outputs one wavelength multiplexed optical signal. For example, in the case that the data rate of the output beam outputted from the LDs 51 is 25 Gbps, the data rate of the optical signal for which four output beams are wavelength-multiplexed becomes 100 Gbps. It is preferable to mount the optical multiplexer 53 on the TEC 54 in the case that temperature dependency of an optical characteristic thereof is relatively high and it is needed to keep the optical characteristic fixed. However, the optical multiplexer 53 may not be always mounted on the TEC 54. The optical multiplexer 53 is configured by a combination of optical filters or the like utilizing an optical thin film or an arrayed waveguide grating (AWG: Arrayed Waveguide Grating), for example.

The TEC (ThermoElectric Cooler) 54 is the thermoelectric element which cools or heats the active element thermally coupled with the upper surface thereof by utilizing a Peltier effect. By keeping the temperature of the TEC upper surface at a desired target value TSET by the TEC 54, for example, the oscillation wavelength of the LD 51 can be turned to a desired value, and also the other optical characteristic or electrical characteristic can be maintained at a prescribed value. The TEC 54 is, for example, when the temperature of a TEC lower surface (heat radiation surface) is defined as T4, performs cooling when T4>TSET (target value) is to be attained, and performs heating when T4<TSET is to be attained. Between the case of heating and the case of cooling, polarity of a voltage to be applied to the TEC and a current to flow to the TEC become opposite. Therefore, for control, an exclusive control circuit including an H bridge circuit or the like is needed. The TEC 54 requires large electrical power as a temperature difference T4−TSET becomes large, and consumes the electrical power of several W for example in order to cool or heat the temperature of the LDs 51 by several 10° C. The active element may be not only the LDs 51 but also both of the LDs 51 and the LD driver circuit 52, and further, may include the optical multiplexer 53 and the thermal sensor (thermistor) 55 which hardly generates the heat in addition to them. That is, the elements thermally coupled with the TEC upper surface can be targets of the temperature control by the TEC 54. Practically, they often take a configuration of being mounted on the TEC upper surface by brazing, adhesion by a resin, or the like. Also, the configuration of the TEC 54 and the active element on the upper surface of the TEC 54 may be such that thermal coupling is executed through a carrier (not shown in the figure) in order to facilitate mass production. Also, in the state that the voltage and the current are not supplied from the control circuit to the TEC 54 and the TEC 54 is not being energized, thermal conductivity between the upper surface and the lower surface of the TEC 54 is extremely low and it can be considered that they are almost thermally isolated to each other.

The thermal sensor (thermistor) 55 is mounted on the TEC 54, and senses the temperature of the upper surface of the TEC 54, that is, the temperature of the LDs 51 which are the active elements. The thermal sensor 55 is a thermistor, for example. Since a resistance value changes depending on the change of the temperature in the thermistor, for example, by detecting the change of the resistance value as the change of the voltage by a voltage dividing circuit, the temperature change to a reference temperature is calculated, and the temperature of a part where the thermistor is mounted can be estimated. The thermal sensor 55 is electrically connected with the TEC control circuit 13 and the MCU 12 through a signal terminal or the like, and inputs a temperature sensing signal (for example, a value of the voltage described above) to the TEC control circuit 13 and the MCU 12. The MCU 12 fetches the temperature sensing signal as a digital value in a fixed cycle (for example, an interval of several 10 mS to several 100 mS) by an internal AD (analog/digital) converter. Also, since the LDs 51 are mounted on the TEC 54 as described above, it is assumed that the temperature of the upper surface of the TEC 54 detected by the thermal sensor 55 is an LD temperature and descriptions will be given hereinafter.

Here, referring to FIG. 2A, FIG. 2B, and FIG. 3, electrical interconnections of the individual components of the optical transmitting unit 10, the integrated optical transmitter module 11 in particular, will be described. FIG. 2A and FIG. 2B are diagrams for illustrating an electrical interconnection state of the individual components in the integrated optical transmitter module, FIG. 2A illustrates a diagram of a side view of the integrated optical transmitter module 11, and FIG. 2B illustrates a diagram of a planar view of the integrated optical transmitter module 11, respectively. Also, FIG. 3 is a diagram for illustrating the electrical interconnection state of the individual components in the optical transmitting unit 10 inside the optical transceiver. Also, FIG. 2A, FIG. 2B, and FIG. 3 do not illustrate the entire configuration included in the optical transmitting unit 10 and both illustrate the minimum configuration for illustrating the electrical interconnection state. Therefore, the configuration is appropriately omitted and described.

As illustrated in FIGS. 2A and B, inside the package 56 of the integrated optical transmitter module 11, the LDs 51, the LD driver circuit 52, the optical multiplexer 53, the TEC 54, and the thermal sensor 55 described above are housed, and a plurality of terminals 61 are equipped as relay means for electrically connecting them and the outside. The LDs 51 and the LD driver circuit 52 as examples of the active elements described above are thermally coupled with the outside of the package 56 through the plurality of electric wires connected with the plurality of terminals 61.

For the terminals 61, for example, the ones for which lead-free plating (Sn—Bi, Sn, Sn—Cu, Ni/Pd/Cu or the like) is executed to a surface of a metal matrix (Cu, 42 alloy, CuW, FeNiCo or the like) or copper foil on ceramic can be used. The terminals 61 become relay points that electrically connect the individual components inside the package 56 and the individual components which are the components of the optical transmitting unit 10 and are arranged outside the package 56. The terminals 61 include a plurality of signal terminals 61a and a plurality of power supply terminals 61b. The signal terminals 61a are electrically connected with the individual components inside the package 56 through bonding wires 62 or the like. Also, the signal terminals 61a are electrically connected with the components arranged outside the package 56 such as the MCU 12 (see FIG. 3) through a printed board 81 and a flexible printed board 63 (FPC; Flexible Printed Circuits) or the like. Thus, for example, control signals from the MCU 12 can be transmitted to the individual components inside the package 56. That is, for example, instruction signals related to the energization of the MCU 12 (see FIG. 3) according to an instruction from the external device 30 (see FIG. 1) are transmitted to the LD driver circuit 52 (IC chip) through the terminals 61 in this way. Also, while the inside and the outside of the package 56 are electrically connected similarly to the signal terminals 61a, the power supply terminals 61b are used to supply a power supply voltage generated by the voltage generation circuit (internal power supply) 17 (see FIG. 1) to the individual components inside the package 56.

The signal terminals 61a and the power supply terminals 61b are electrically connected with the individual configurations inside the package 56 of the LDs 51, the LD driver circuit 52, the TEC 54, and the thermal sensor 55 or the like through gold bonding wires 62 (wiring) for example. By being connected through the bonding wires 62, the signals terminals 61a and the power supply terminals 61b, and the upper surface of the TEC 54 are thermally coupled.

Then, as illustrated in FIG. 3, the signal terminals 61a and the power supply terminals 61b are connected with the printed board 81 on the outside of the package 56 (and in the inside the optical transmitting unit 10) through the flexible printed board 63 or the like. To the printed board 81, the individual components arranged on the outside of the package 56, for example, the MCU 12 and the temperature detection circuit 14 or the like, are connected. That is, through the bonding wires 62 and the terminals 61, the individual components inside the package 56 and the individual configurations outside the package 56 are electrically connected. Also, through the bonding wires 62 and the terminals 61, the upper surface of the TEC 54 and the outside of the package 56 are thermally coupled. In the present embodiment, since the four LDs 51 are housed inside the package 56, the number of the terminals 61 and the bonding wires 62 is increased compared to the case of only one LD accordingly. Therefore, the thermal conductivity between the upper surface of the TEC 54 whose temperature is detected by the thermal sensor 55 and the outside of the package 56 is increased several times compared to the case of only one LD.

Going back to FIG. 1, the MCU (Micro Controller Unit) 12 controls the energization of the active elements such as the LD driver circuit 52, and controls the TEC 54 or the like. Specifically, by inputting the enable signal, the LD driver circuit 52 and the TEC control circuit 13 are activated. Also, the MCU 12 activates the LD bias current circuit 15 by input of the enable signal, and operates the LDs 51. For each enable signal, control of whether to enable or disable (interrupt) output of each circuit that receives the signal is a first purpose. When disabling (interrupting) the output of each circuit by the enable signal, it is preferable that current consumption of the circuit itself be reduced.

In order to enable the above-described control, the MCU 12 is electrically connected with the TEC control circuit 13, the LD bias current circuit 15, and the LD driver circuit 52. Also, in order to acquire the internal temperature of the optical transmitting unit 10, the MCU 12 is electrically connected with the temperature detection circuit 14. Here, from the viewpoint of miniaturizing the optical transmitting unit 10, the electrical connection is performed by a serial communication bus, specifically an I2C (Inter-Integrated Circuit) bus 71. That is, the MCU 12, the TEC control circuit 13, the temperature detection circuit 14, the LD bias current circuit 15, and the LD driver circuit 52 are electrically connected by the I2C bus 71. The I2C bus has two signal lines that are a clock signal line (SCL) and a data signal line (SDA), and realizes communication among the individual circuits (ICs) by the signal lines only.

When mutually switching an operating mode and a power saving mode of the optical transceiver 1 on the basis of the instruction signal from the external device 30 connected through the communication control circuit 18 and the communication bus 72, the MCU 12 controls the operation state of the integrated optical transmitter module 1.

The operating mode is a mode that the TEC control circuit 13, the LD driver circuit 52, and the LDs 51 (that is, the LD bias current circuit 15) are activated (energized). That is, the state that the integrated optical transmitter module 11, the integrated optical receiver module 21, the signal processing circuits 19 and 22, and the circuit related to the control thereof or the like are activated on the basis of the instruction signal from the external device 30 and transmission and reception of the optical signals are enabled is the operating mode. In the operating mode, basically the individual components inside the optical transceiver 1 are all energized and are performing prescribed functions, and for example, in the case of a CFP optical transceiver, the power of 8 W or more is consumed.

On the other hand, the power saving mode is a mode that power saving defined by the MSA or demands from the market is attempted, and is the mode of stopping (not energizing) the communication other than the communication required for a so-called DDM (Digital Diagnosis Monitoring) function such as the communication with the external device 30 of the upper layer. Specifically, in the power saving mode, the TEC control circuit 13, the LD driver circuit 52, and the LDs 51 (that is, the LD bias current circuit 15) are stopped. That is, the state that only a portion (for example, the MCU 12 and the communication control circuit 18) of the control circuit including a microcomputer is activated when the optical transceiver 1 is supplied with power (when it is activated) or the like, and only limited functions such as monitoring of an internal state of the optical transceiver 1 and establishment of the communication with the external device 30 which is a host are operated is the power saving mode. Also, as a modification, in the power saving mode, the integrated optical receiver module 21, the signal processing circuits 19 and 22, and the voltage generation circuit 17 or the like may be stopped.

Figure 4A:
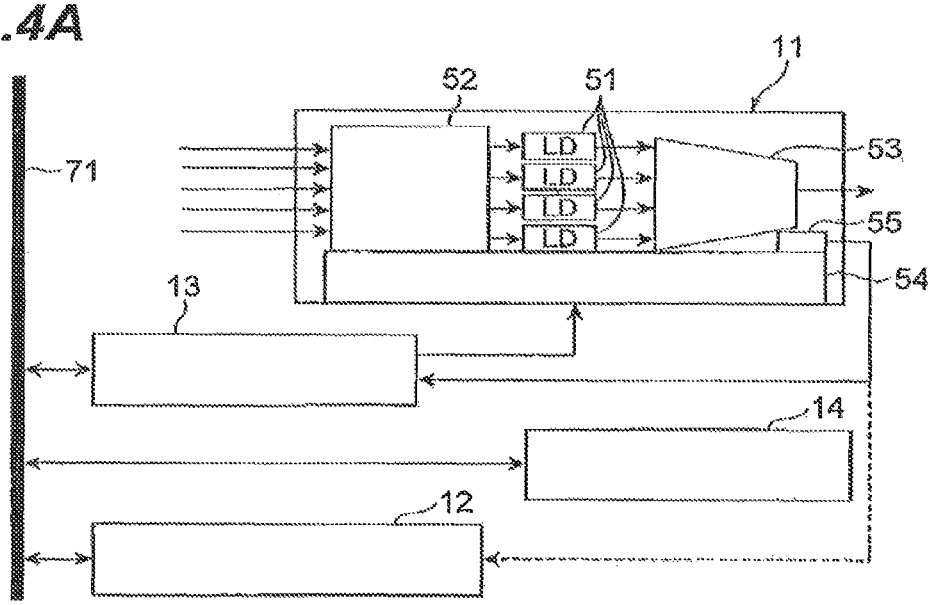
FIG. 4A is a diagram for illustrating a method of deriving an internal temperature in each operation mode.

Even in the power saving mode, by maintaining the monitoring of the internal state and the communication with the external device 30, an inquiry or an instruction related to the monitoring/control of the internal state from the external device 30 can be answered based on the MSA standard. An example of the inquiry related to the internal state from the external device 30 is an inquiry related to the internal temperature of the optical transmitting unit 10. In a normal state (the state of the operating mode), such an internal temperature is detected by the temperature detection circuit 14 that is exclusively prepared. The temperature detection circuit 14 is the component independent of the integrated optical transmitter module 11, is arranged at a position where a representative temperature of the optical transmitting unit 10 can be detected, and inputs the temperature outside the package which is the detected temperature (digital value) near itself through the I2C bus 71 to the MCU 12 (see FIG. 4A). That is, the MCU 12 defines the temperature detected by the temperature detection circuit 14 as the internal temperature in the operating mode, and when inquired, transmits the information to the external device 30, or stores it inside a prescribed register to be read as needed from the external device 30. The MCU 12 stores the temperature detected by the temperature detection circuit 14 to the memory 16 as the internal temperature information.

Here, in the I2C bus, at even one of the connected terminals, when the power supply voltage supplied to the component (IC) having the terminal is stopped, a signal level of the I2C bus is fixed low, and the communication of all the configurations connected to the I2C bus is disabled. As described above, the MCU 12, and the TEC control circuit 13, the temperature detection circuit 14, the LD bias current circuit 15, and the LD driver circuit 52 are electrically connected by the I2C bus 71. In the power saving mode, for example, since the component such as the TEC control circuit 13 is stopped, the MCU 12 and the temperature detection circuit 14 cannot perform the communication through the I2C bus. Therefore, in the power saving mode, the MCU 12 cannot acquire the internal temperature detected by the temperature detection circuit 14. Preparing another I2C bus for the communication with the temperature detection circuit 14 can be considered, however, since the number of signals is increased and a mounting area of the wiring is increased by that, it is not preferable in the miniaturization of the optical transceiver.

Figure 4B:
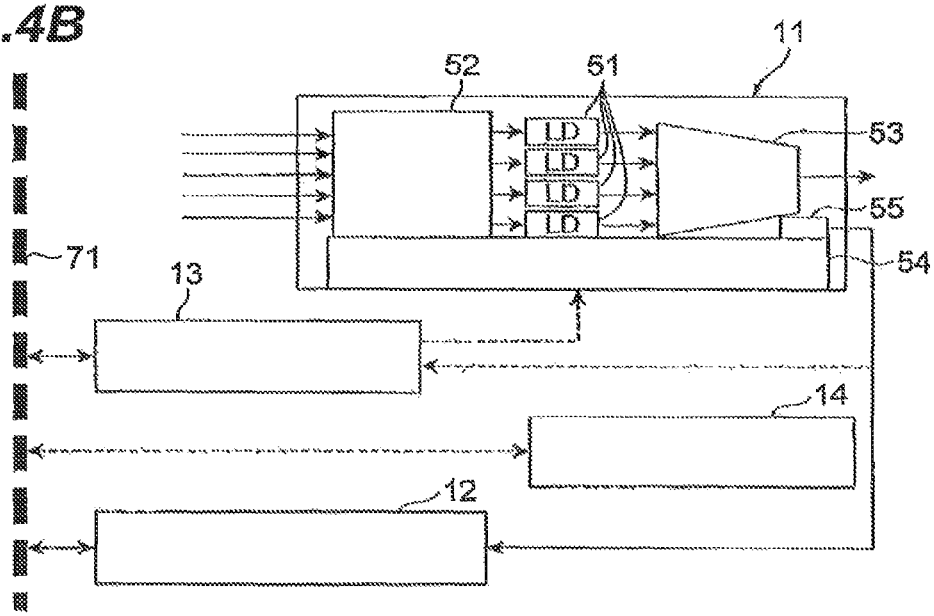
FIG. 4B is a diagram for illustrating a method of deriving an internal temperature in each operation mode.

Then, in the power saving mode, the MCU 12 estimates the internal temperature on the basis of an LD temperature on the upper surface of the TEC 54, that is detected by the thermal sensor 55 on the TEC 54 (see FIG. 4B). More specifically, the MCU 12 calculates the internal temperature on the basis of the temperature detected by the thermal sensor 55 and the internal temperature information stored in the memory 16, and stores the calculated internal temperature to the memory 16 as new internal temperature information. Hereinafter, the estimation of the internal temperature of the optical transmitting unit 10 based on the LD temperature on the upper surface of the TEC 54, that is detected by the thermal sensor 55, in the power saving mode will be described. Also, as the power saving mode, there are a mode to be shifted to after initialization is performed when the optical transmitting unit 10 is supplied with the power (hereinafter described as a direct read mode), and a mode to be shifted to after undergoing the operating mode once (hereinafter described as a correction mode). The estimation of the internal temperature in the respective modes will be described in order.

In the direct read mode, the MCU 12 estimates the LD temperature on the upper surface of the TEC 54, that is detected by the thermal sensor 55, as the internal temperature of the optical transmitting unit 10 as it is. In the direct read mode not having undergone the operating mode, since the TEC 54 is before being operated, the upper surface of the TEC 54 is not subjected to the temperature change by the temperature control of the TEC 54 and not influenced by heat generation of the active element. Therefore, it is considered that the temperature of the upper surface of the TEC 54 and the temperature outside the package 56 (the internal temperature which is the representative temperature inside the optical transmitting unit 10) roughly coincide.

In the correction mode, the MCU 12 estimates the corrected one of the LD temperature on the upper surface of the TEC 54, that is detected by the thermal sensor 55, as the internal temperature of the optical transmitting unit 10. In the case that the operating mode is attained once and the TEC 54 is operated, the temperature on the upper surface of the TEC 54 is turned to the temperature controlled by the TEC control circuit 13, and a divergence is generated between the temperature on the upper surface of the TEC 54 (the temperature detected by the thermal sensor 55) and the temperature outside the package 56 (the internal temperature which is the representative temperature inside the optical transmitting unit 10). Therefore, in order to accurately estimate the internal temperature of the optical transmitting unit 10, it is needed to correct the LD temperature on the upper surface of the TEC 54, that is detected by the thermal sensor 55. When prescribed time elapses after the operating mode is switched to the power saving mode, since the upper surface of the TEC 54 and the outside of the package 56 reach a balanced state and the respective temperatures start to roughly coincide, in that case, the above-described direct read mode is attained again, and the LD temperature on the upper surface of the TEC 54, that is detected by the thermal sensor 55, can be estimated as the internal temperature of the optical transmitting unit 10 as it is.

Hereinafter, a specific correction method will be described. When the time at which the operating mode is switched to the power saving mode is defined as t=0, the internal temperature of the optical transmitting unit 10 (the temperature outside the package 56) is defined as $T_0$, the detection temperature of the thermal sensor 55 is defined as T, thermal conductivity of the bonding wires 62 driven on the upper surface of the TEC 54 is defined as K, a cross sectional area of each bonding wire 62 is defined as Si, its length is defined as li (i=1, 2, 3 . . . M), each component (such as the LDs 51) arranged on the upper surface of the TEC 54 is defined as j=1, 2, 3 . . . N, specific heat of each component arranged on the upper surface of the TEC 54 is defined as σj, specific gravity is defined as ρj, volume is defined as Vj, and the change of the detection temperature of the thermal sensor 55 in very short time dt is defined as dT, the following formula (2) is established. In the power saving mode, since the control of the TEC 54 is stopped, neither the voltage nor the current is supplied to the TEC 54. In the state, the thermal conductivity between the upper surface (temperature control surface) and the lower surface (heat radiation surface) of the TEC 54 is extremely low, and it can be considered that it is the almost heat insulated state between them. Thus, it is assumed that inflow and outflow of the heat from/to the outside with the TEC itself as a route of thermal conduction can be neglected.

[formula 2]

$$K\sum_{i=1}^{M} \frac{S_i}{l_i}(T_0(t)-T)*dt = \sum_{j=1}^{N} \rho_j \sigma_j V_j * dt \qquad (2)$$

Now, when it is approximated that the time change of $T_0(t)$ is gentler than the time change of T(t), after the operating mode is switched to the power saving mode, the temperature T(t) detected by the thermal sensor 55 at the time t is indicated by the following formula (3).

[formula 3]

$$T(t) = T_0(t) + A\exp\left(\frac{-K\sum_{i=1}^{M}\frac{S_i}{l_i}}{\sum_{j=1}^{N}\rho_j\sigma_j V_j}t\right) \quad (3)$$

A value inside Σ in the formula (3) is, since it is determined by a material/structure of the integrated optical transmitter module 11, a value determined when parts to be incorporated in the optical transmitting unit 10 are determined. Therefore, the value of Σ is also determined when the parts to be incorporated in the optical transmitting unit 10 are determined. An arbitrary constant A is A=T(0)−T₀(0). Reference character T₀(0) denotes the temperature detected in the temperature detection circuit 14 immediately before the operating mode is switched to the power saving mode (immediately before stopping the energization of the active element). Also, reference character T(0) denotes a target value TSET of the TEC 54 controlled by the TEC control circuit 13 in the operating mode. The arbitrary constant A is derived from those values. Since the arbitrary constant A is uniquely determined, the internal temperature $T_0$ of the optical transmitting unit 10 can be estimated by performing prescribed correction according to the arbitrary constant A to the detection temperature T of the thermal sensor 55. The correction here may be, for example, to accurately obtain the value of Σ by actual measurement using an actually manufactured optical transceiver.

Also, the formula (3) is indicated by the following formula (4) when the thermal resistance between the active element on the upper surface of the TEC 54 and the temperature detection circuit 14 is defined as RTOSA, and the total thermal capacity by the active target element on the upper surface of the TEC 54 or the like (the thermal capacity to be heated and cooled by the TEC 54) is defined as CTOSA.

[formula 4]

$$T(t) = T_0(t) + A\exp\left(\frac{-K\sum_{i=1}^{M}\frac{S_i}{l_i}}{\sum_{j=1}^{N}\rho_j\sigma_j V_j}t\right) = T_0(t) + A\exp\left(-\frac{t}{RTOSA \cdot CTOSA}\right) \quad (4)$$

That is, RTOSA and CTOSA can be indicated as follows.

[formula 5]

$$RTOSA = 1/K\sum_{i=1}^{M}(S_i/l_i) \quad (5)$$

[formula 6]

$$CTOSA = \sum_{j=1}^{N}\rho_j\sigma_j V_j \quad (6)$$

Here, it is assumed that the detection temperature of the thermal sensor 55 at the time $t=t_1$ is $T(t_1)$. In the meantime, when it is assumed that there is no change in the internal temperature $T_0$ of the optical transmitting unit 10 at $t=t_1$, from the internal temperature $T_0(0)$ detected in the temperature detection circuit 14 and the temperature T(0) detected in the thermal sensor 55 immediately before the operating mode is switched to the power saving mode, the detection temperature $T(t_1)$ of the thermal sensor 55 in the case that there is no change in the internal temperature $T_0$ of the optical transmitting unit 10 is obtained from calculation.

In the case that there is the change in the internal temperature $T_0$ of the optical transmitting unit 10, since the change portion is taken as a difference between the above-described detection temperature $T(t_1)$ and detection temperature $T(t_0)$, it can be estimated that the internal temperature $T_0$ of the optical transmitting unit 10 is changed from $T_0(0)$ to $T_0(t_1)=T(t_1)-T'(t_1)+T_0(0)$. Similarly at the further advanced time $t=t_2$, the detection temperature $T(t_2)$ of the thermal sensor 55 is acquired, and from the detection temperature $T'(t_2)$ obtained from the calculation, the internal temperature $T_0$ of the optical transmitting unit 10 can be estimated as $T_0(t_2)=T'(t_2)-T(t_2)+T_0(0)$. In this way, the internal temperature $T_0(0)$ detected in the temperature detection circuit 14 immediately before the operating mode is switched to the power saving mode is defined as the initial value of the detection temperature T(t), and the internal temperature $T_0(t)$ of the optical transmitting unit 10 at each time can be estimated from the detection temperature T(t) of the thermal sensor 55 by the actual measurement and the detection temperature T'(t) of the thermal sensor 55 obtained from the calculation.

Also, it is preferable that the thermal conductivity between the active elements such as the LDs 51 and the upper surface of the TEC 54 be as high as possible in order to efficiently regulate (control) the temperature of the LDs 51 by utilizing the Peltier effect of the TEC 54. Thus, in the case that the thermal resistance between the LDs 51 and the upper surface of the TEC 54 is defined as RL, it is preferable that

[formula 7]

$$RL < RTOSA \quad (7)$$

be satisfied. For example, in the case of taking the structure that the active elements are mounted on the carrier or the like and then the carrier or the like is mounted on the upper surface of the TEC 54, since RL becomes large when the thermal conductivity of the carrier is low, it is preferable that a material of the carrier be high in thermal conductivity and that thickness of the carrier be thin. If RTOSA is smaller than RL, since the temperature on the upper surface of the TEC 54 fluctuates due to in and out of the heat from/to the outside of the package 56, efficiency of the temperature regulation (control) by the TEC 54 is deteriorated.

Also, as a premise of performing the estimation of the internal temperature $T_0$ described above, the change of the internal temperature $T_0$ needs to be gentler than the change of the detection temperature T after the operating mode is switched to the power saving mode. The condition can be indicated by an index (corresponding to a "time constant" in an electric circuit) that how easily the thermal capacity is changed by the thermal resistance related thereto. That is, in the case that the thermal resistance between the temperature detection circuit 14 and the outer side surface of the optical transmitting unit 10 is defined as RTRX, and the total thermal capacity inside the optical transmitting unit 10 is defined as CTRX, satisfaction of

[formula 8]

$$\frac{1}{RTOSA \times CTOSA} > \frac{1}{RTRX \times CTRX} \quad (8)$$

is needed.

The TEC control circuit 13 controls the TEC 54, and brings the LD temperature close to the target value TSET set on the basis of the instruction signal from the MCU 12. Specifically, the TEC control circuit 13 is connected to the TEC 54, is activated according to an enable signal of TEC control circuit inputted from the MCU 12, and operates the TEC 54. The control of the LD temperature by the TEC control circuit 13 is executed by feedback control called ATC (Automatic Temperature Control). That is, the TEC control circuit 13 detects the temperature (LD temperature) on the TEC upper surface by an LD temperature sensing signal from the thermal sensor 55. Further, the TEC control circuit 13 supplies required voltage and current to the TEC 54 so that the temperature coincides with the target value TSET by an exclusive drive circuit including the H bridge circuit or the like, and controls heating or cooling in the TEC 54.

The memory 16 is the storage device where the information can be read and written from the MCU 12, and stores various kinds of information to be used when the MCU 12 estimates the internal temperature $T_0$ in the power saving mode. That is, the memory 16 stores the value of $\Sigma$ in the formula (3) calculated based on the parts to be incorporated in the optical transmitting unit 10 recognized beforehand, the temperature T(0) detected in the temperature detection circuit 14, and the internal temperature $T_0(0)$ detected in the thermal sensor 55 immediately before the operating mode is switched to the power saving mode, or the like.

The voltage generation circuit (internal power supply) 17 is controlled through an exclusive signal line by the MCU 12, and generates at least one internal power supply needed by the integrated optical transmitter module 11 and the LD bias current circuit 15 or the like from an external power supply. The MCU 12 instructs the voltage generation circuit (internal power supply) 17 through an exclusive signal line to supply an internal voltage to the integrated optical transmitter module 11 or the LD bias current circuit 15 or to stop the supply. The exclusive signal line may be a single signal line which transmits high and low digital binary voltage levels, or the serial communication bus such as the I2C bus may be used.

Next, processing when the external power supply is supplied and the optical transceiver is activated, operated first in the power saving mode, and mutually shifted between the operating mode and the power saving mode thereafter will be described with reference to FIG. 5. FIG. 5 is a flowchart for illustrating the individual operation modes of the optical transceiver and the processing of the optical transceiver related to the temperature estimation.

First, when the external power supply is supplied by the external device 30, the optical transceiver 1 is activated, and the MCU 12 performs the initialization (step S1). While the internal temperature is estimated in a subroutine to be described later, in order to determine the operation state (operation mode) of the optical transceiver and determine whether it is the direct read mode or the correction mode there, a state flag and an estimation flag are used. After the optical transceiver is activated, execution start of firmware inside the MCU 12, establishment of the communication with the external device 30, and setting related to the control during the operating mode of the integrated optical transmitter module and the integrated optical receiver module or the like are performed, however, their descriptions will be omitted. The state flag and the estimation flag can be used by allocating one bit each in a prescribed register inside the MCU 12, for example. In the initialization, the MCU 12 turns the state flag and the estimation flag to zero (clears them). Thereafter, the optical transceiver 1 is operated in the power saving mode (step S2). Specifically, the optical transceiver 1 performs the communication with the external device 30, updates the information in the register inside and transmits it to the external device 30. For example, when inquired about the internal temperature from the external device 30, the processing is shifted to the subroutine of estimating the internal temperature to be described later (hereinafter called an "internal temperature estimation subroutine"), and when returned from there, on the basis of the result, the information in a specific register allocated in order to store the information of the internal temperature (not shown in the figure. Hereinafter called an "internal temperature register") is updated. When instructed from the external device 30 to move to the operating mode (step S3; Yes), the optical transceiver 1 advances to step S4, and continues the operation in the power saving mode until then (step S3; No).

Subsequently, in step S4, in order to determine that it is the operating mode there when the internal temperature estimation subroutine is called, the MCU 12 sets the state flag to "1". Next, in order to estimate the internal temperature on the basis of the temperature detected by the thermal sensor 55 when shifted to the power saving mode, the MCU 12 sets the estimation flag to "1". Then, the MCU 12 activates the voltage generation circuit 17, and activates main circuits (the integrated optical transmitter module 11, the integrated optical receiver module 21, the signal processing circuits 19 and 22, the TEC control circuit 13 and the LD bias current circuit 15 which are the drive circuits, and the control circuit (not shown in the figure) or the like). The temperature detection circuit 14 is also included in the main circuits. The communication and control with the main circuits by the MCU 12 can be performed through the I2C bus 71. When preparation of the main circuits is completed, the optical transceiver 1 performs the operation in the operating mode (step S6). In the operating mode, the MCU 12 continuously performs the communication with the external device 30 as well. For example, when inquired about the internal temperature from the external device 30, the processing is shifted to the internal temperature estimation subroutine, and when returned from there, the information in the internal temperature register is updated on the basis of the result. Also, when instructed from the external device 30 to shift to the power saving mode (step S7; Yes), the processing advances to step S8, and the operation is continued in the operating mode until then (step S7; No).

Subsequently, in step S8, in order to determine that it is the power saving mode there when the internal temperature estimation subroutine is called, the MCU 12 sets the state flag to "0". Next, in step S9, the information needed for the estimation of the internal temperature is preserved. That is, a count-up timer for measuring the time t after shift to the power saving mode is started is reset (turned to t=0). Further, temperature information ($T_0(0)$) detected in the temperature detection circuit 14 when starting to shift to the power saving mode (t=0) and temperature information (T(0)) detected in the thermal sensor 55 are stored in the prescribed register or the memory. Then, the MCU 12 stops the main circuits, and stops the voltage generation circuit 17 (step S10). After that, the processing returns to step S2 in order to perform the operation in the power saving mode.

As described above, the optical transceiver 1 is operated in the power saving mode after being activated, and switches between the operating mode and the power saving mode by the instruction from the external device 30 thereafter. In the case of completely stopping or resetting the optical transceiver, a specific instruction code is sent from the external device 30 or external interruption is applied to the MCU 12 by the exclusive signal line, however, it can be coped with by shifting the processing to the exclusive subroutines from step S2 or step S6. The descriptions for the exclusive subroutines will be omitted.

Next, the processing of the internal temperature estimation subroutine will be described with reference to FIG. 6. FIG. 6 is a flowchart for illustrating the processing related to the estimation of the internal temperature.

The internal temperature estimation subroutine is executed by the MCU 12 when inquired from the external device 30 about the information of the internal temperature, during the operation in the power saving mode (step S2 in FIG. 5) or during the operation in the operating mode (step S6 in FIG. 5). When the subroutine is started, in step T1, whether the operation state of the optical transceiver at present is the power saving mode or the operating mode is determined by the value of the state flag. That is, since it is the power saving mode when the state flag is "0", the processing advances to step T2 (step T1; Yes), and since it is the operating mode when the state flag is "1", the processing advances to step T9 (step T1; No).

Subsequently, when it is determined as the power saving mode, whether to perform the processing in the direct read mode or to perform the processing in the correction mode regarding the temperature estimation in step T2 is determined by the value of the estimation flag. That is, when the estimation flag is "0" and the processing is to be performed in the direct read mode, the processing advances to step T3 (step T2; Yes), and when the estimation flag is "1" and the processing is to be performed in the correction mode, the processing advances to step T4 (step T2; No).

Next, the processing (step T3) in the direct read mode will be described. In the direct read mode, since it can be considered that the upper surface of the TEC 54 where the thermal sensor 55 is mounted inside the package 56 and the outside of the package 56 are roughly in a thermally balanced state, the information of the LD temperature on the upper surface of the TEC 54, that is detected by the thermal sensor 55, is stored in the internal temperature register as the internal temperature of the optical transmitting unit 10 as it is, and the processing returns to called original step.

Then, the processing (step T4) in the correction mode will be described. In the correction mode, the MCU 12 estimates the internal temperature by a method described below on the basis of the information of the LD temperature on the upper surface of the TEC 54, that is detected by the thermal sensor 55, and stores the information in the internal temperature register. In an estimation method, first, using the formula (4), from the temperature information $T_0(0)$ and $T(0)$ preserved when the operating mode is shifted to the power saving mode (step S9 in FIG. 5) and the time t=t1 of the count-up timer at present, the detection temperature $T'(t_1)$ of the thermal sensor 55 in the case of assuming that there is no change in the internal temperature $T_0$ of the optical transmitting unit 10 is obtained. Then, by the $T'(t1)$, the temperature $T(t_1)$ actually detected by the thermal sensor 55, and the preserved temperature information $T_0(0)$, the internal temperature $T_0(t1)$ is estimated by $T_0(t1)=T(t1)-T'(t1)+T_0(0)$.

Step T4 only is sufficient for the estimation of the internal temperature in the correction mode, however, when the operating mode is shifted to the power saving mode and several seconds to several tens of seconds elapse, for example, since coping can be performed by the direct read mode described above, changeover of the mode is determined for that in steps T5-T8. That is, from the time t0 of the count-up timer when the internal temperature is estimated in the correction mode last time, an estimated value $T_0(t0)$ of the internal temperature at the time, the time t1 of this time, and the estimated value $T_0(t1)$ of the internal temperature, volatility=$(T_0(t1)-T_0(t0))/(t1-t0)$ is calculated from a change amount $T_0(t1)-T_0(t0)$ of the estimated value of the internal temperature in elapsed time t1-t0 (step T5). The volatility is compared with a prescribed reference value, and when the volatility is equal to or smaller than the reference value (step T6; Yes), the estimation flag is turned to "0" (step T7), and when the volatility is larger than the prescribed reference value (step T6; No), the estimation flag is kept at "1", and the values of t1 and $T_0(t1)$ of this time are preserved as t0 and $T_0(t0)$ for the next determination (step T8). As a location of preservation, for example, the register or the memory can be used.

On the other hand, in the case of determining that it is the operating mode in step T1, the information of the temperature detected by the temperature detection circuit 14 is stored in the internal temperature register as the internal temperature (step T19). In the operating mode, the power supply voltage is supplied to the temperature detection circuit 14, the internal temperature can be detected, and the temperature detection circuit 14 and the MCU 12 can communicate through the I2C bus 71. Therefore, the MCU 12 can receive the information of the internal temperature from the temperature detection circuit 14 by the serial communication, and store it in the internal temperature register.

As above, in the optical transmitting unit 10 according to the present embodiment, the method of deriving the internal temperature of the optical transmitting unit 10 is changed according to whether or not the LDs 51 are being energized, that is, whether it is the operating mode or the power saving mode.

Conventionally, from the viewpoint of miniaturizing not only the optical transmitting unit but also the optical transceiver, the MCU and the individual configurations controlled by the MCU, the TEC control circuit and the temperature detection circuit or the like for example, are sometimes electrically connected by the serial communication bus such as the I2C bus. In this case, when the power supply to one of the configurations connected to the serial communication bus is stopped when shifted to the power saving mode defined by the MSA, since the MCU and the temperature detection circuit cannot perform the communication, the MCU cannot acquire the internal temperature. Therefore, even when there is an inquiry related to the internal temperature from the external device, sometimes the internal temperature cannot be transmitted.

In this respect, in the optical transmitting unit 10 according to the present embodiment, in the power saving mode, that is, when the LDs 51 are not being energized, the internal temperature of the optical transmitting unit 10 (an average temperature outside the package 56) is calculated on the basis of the temperature detected by the thermal sensor 55 arranged on the upper surface of the TEC 54 inside the package 56 and the internal temperature information stored in the storage device. In the power saving mode, while the temperature cannot be acquired from the temperature detection circuit 14 connected by the I2C bus 71, the internal temperature is estimated using the temperature detected by the thermal sensor 55. As a result, the internal temperature of the optical transmitting unit 10 can be surely derived even in the power saving mode. Also, since the active elements whose temperature is detected by the thermal sensor 55 are thermally coupled with the outside of the package 56, in the case that the active elements (for example, the LDs 51, the LD driver circuit 52, and the like) are not generating the heat by the energization, the temperature detected by the thermal sensor 55 becomes the value corresponding to the temperature outside the package. Therefore, the estimation of the internal temperature of the optical transmitting unit 10 based on the temperature detected by the thermal sensor 55 described above is enabled.

Also, in the operating mode, that is, when the active elements are being energized, the temperature detected by the temperature detection circuit 14 provided on the outside of the package 56 (and in the inside of the optical transmitting unit 10) is defined as the internal temperature of the optical transmitting unit 10. In this way, by deriving the internal temperature of the optical transmitting unit 10 by the temperature detection circuit 14 provided on the outside of the package, even in the case that the active elements are generating the heat by being energized and the temperature inside the package 56 is locally rising, the internal temperature inside the optical transmitting unit 10 can be appropriately derived.

The optical transmitting unit 10 according to the present embodiment utilizes the temperature detected by the thermal sensor 55 which is the configuration originally for detecting the temperature of the TEC 54 also for detecting the internal temperature of the optical transmitting unit 10, and a new configuration is not added to detect the internal temperature of the optical transmitting unit 10. Therefore, the miniaturization of the optical transmitting unit 10 is not adversely affected. From the above, according to the optical transmitting unit 10 according to the present embodiment, the internal temperature can be surely and appropriately detected regardless of the operation state while miniaturizing the optical transmitting unit 10.

Also, in the case that the thermal resistance between the active elements on the upper surface of the TEC 54 and the temperature detection circuit 14 is defined as RTOSA, the thermal resistance between the temperature detection circuit 14 and the outer side surface of the optical transmitting unit 10 is defined as RTRX, the thermal capacity on the upper surface of the TEC 54 is defined as CTOSA, and the thermal capacity inside the optical transmitting unit 10 is defined as CTRX, because

[formula 9]

$$\frac{1}{RTOSA \times CTOSA} > \frac{1}{RTRX \times CTRX} \quad (9)$$

is satisfied, the temperature change of the internal temperature of the optical transmitting unit 10 becomes gentler than the temperature change of the temperature detected by the thermal sensor 55. Thus, the internal temperature of the optical transmitting unit 10 on the outside of the package 56 can be highly accurately estimated from the temperature detected by the thermal sensor 55 provided inside the package 56.

Also, the integrated optical transmitter module 11 includes the four LDs 51, and the plurality of signal terminals 61a and power supply terminals 61b, and the package 56 houses the four LDs 51, the LD driver circuit 52, the TEC 54, the thermal sensor 55, and the plurality of signal terminals 61a and power supply terminals 61b. Therefore, the four LDs and the LD driver circuit 52 are thermally strongly coupled with the upper surface of the TEC 54, and are electrically connected and thermally coupled with the plurality of signal terminals 61a and power supply terminals 61b through the bonding wires 62 further.

Conventionally, like an optical transmitter module 101 illustrated in FIG. 7A and FIG. 7B for example, a configuration for which one LD 151 and a thermal sensor 155 are arranged on a TEC 154 and the configuration thereof and an LD driver circuit 152 and terminals 161 are electrically connected by bonding wires 162 is known. In such a configuration, since there is one LD 151, the number of the terminals 161 is small accordingly, and the thermal conductivity between the upper surface of the TEC 154 and the outside of a package 156 is low. In a comparative example in FIG. 7A and FIG. 7B, the active element is the LD 151, cooling is performed by utilizing the Peltier effect of the TEC 54 in order to keep the electrical characteristic and optical characteristic of the LD 151 against temperature rise by the heat generation during the energization, and the temperature is regulated by feedback control by an external drive circuit so that the temperature on the upper surface of the TEC 54, that is detected by the thermal sensor 155, becomes the prescribed temperature. The thermal sensor 155 is temperature detection means needed for the feedback control, and is not a target to regulate the temperature. Therefore, the thermal sensor 155 is affected by the temperature control but is not included in the active element (there is no problem even if it is included for the sake of convenience).

In this respect, in the integrated optical transmitter module 11 including the four LDs and the plurality of signal terminals 61a and power supply terminals 61b corresponding to them, the thermal conductivity between the upper surface of the TEC 54 whose temperature is detected by the thermal sensor 55 housed inside the package 56 and the outside of the package 56 increases. Accordingly, the estimation accuracy of the internal temperature of the optical transmitting unit 10 based on the temperature detected by the thermal sensor 55 can be improved. For example, while the number of the terminals 161 and the bonding wires 162 connected to the terminals 161 is six in the comparative example in FIG. 7A and FIG. 7B, in the integrated optical transmitter module in FIG. 2A and FIG. 2B, the number of the terminals 61 and the bonding wires 62 connected to the terminals 61 is 16. Therefore, when it is assumed that individual materials and shapes of the terminals and the bonding wires are the same in FIG. 7A, 7B and FIG. 2A, 2B, it can be considered that the thermal conductivity between the TEC upper surface and the outside of the package in the integrated optical transmitter module in FIG. 2A and FIG. 2B is about 16/6=2.67 times or more than that in the optical transmitter module in FIG. 7.

Also, the thermal sensor 55 is electrically connected with the MCU 12 through the bonding wires 62, the terminals 61 and external electric wires. Then, when estimating the internal temperature on the basis of the temperature detected by the thermal sensor 55 while the LDs 51 are not being energized, the MCU 12 defines the temperature detected by the temperature detection circuit 14 when the LDs 51 are energized most recently (that is, in the state of the operating mode) as the initial value, and estimates the internal temperature. Thus, the internal temperature can be highly accurately estimated when the operating mode is shifted to the power saving mode.

The present invention is not limited to the above-described embodiment and can be appropriately altered within a scope not deviating from the spirit. That is, in the present embodiment, the integrated optical transmitter module has been described with the case of converting the four 25 Gbps electric signals to the optical signals respectively and then performing wavelength multiplex as an example. However, a combination of the number of channels and the data rate is not limited to it, and may be the one of converting 10 Gbps electric signals of 10 wavelengths to the optical signals, for example.

Also, while the optical transceiver has been described with the case of being applied to the CFP2 or the CFP4 as an example, it may be applied to other optical transceivers. Also, while it has been described that the LDs and the LD driver circuit are directly mounted on the TEC upper surface, the LDs and the LD driver circuit may not be always mounted on the TEC. For example, the configuration may be such that the LDs and the LD driver circuit and the TEC are indirectly connected and thermally act on each other through a chip carrier or other members with excellent thermal conductivity or the like.

Example

Hereinafter, on the basis of an example, the estimation of the internal temperature by the optical transmitting unit according to one form of the present invention will be specifically described. The configuration of the optical transmitting unit is not limited to the example below.

Figure 8:
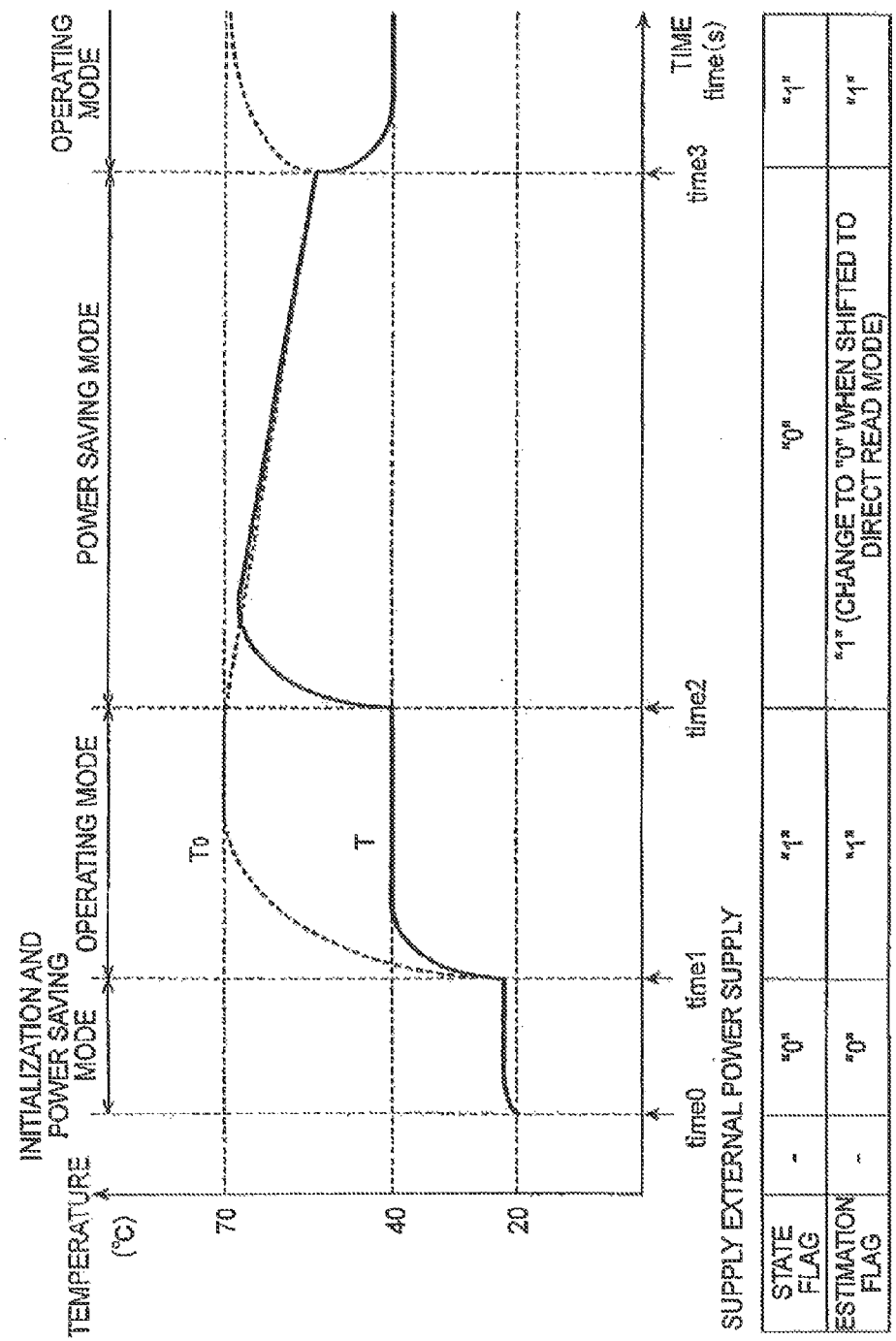
FIG. 8 is a diagram for illustrating relations between a temperature detected by a temperature detection circuit and a temperature detected with a thermal sensor mounted in an optical transmitter module in the individual operation modes.

FIG. 8 is a diagram for illustrating relations between the internal temperature $T_0$ of the temperature detection circuit and the temperature T of the thermal sensor in the individual operation modes. Specifically, it illustrates the individual time change of the internal temperature $T_0$ of the temperature detection circuit 14 and the temperature T of the thermal sensor 55 from the supply of the external power supply through the initialization and the operation in the power saving mode, and further through the operation mode, the power saving mode, and the operation mode. First, it is assumed that the optical transceiver 1 is in the state of being incorporated in the external device 30, and is in the state of not being supplied with the external power supply under an environment of an environmental temperature being 20° C. When the external power supply is supplied by the external device 30 at the time time=time0, the optical transceiver 1 starts the initialization, turns the state flag and the estimation flag to "0", and is operated in the power saving mode. In this state, by the heat generation by power consumption in the power saving mode, $T_0$ rises by several degrees, 1 to 3° C. for example. Since the active elements are not energized, T and $T_0$ are almost equal, and the temperature detected by the thermal sensor 55 is defined as the internal temperature as it is. Then, when shifted to the operating mode at time=time1, since the voltage generation circuit 17 is activated, the main circuits are activated and the power consumption increases, the internal temperature gradually rises, but is almost fixed (for example, it is assumed as 70° C. here) when the heat generation in the inside and heat radiation to the outside are balanced. In the operating mode, since the serial communication bus can be used, the MCU 12 receives the information of the internal temperature ($T_0$) detected in the temperature detection circuit 14 by the serial communication, and defines it as the internal temperature. The upper surface of the TEC 54 approaches a prescribed set value (for example, it is assumed as 40° C. here) by the temperature control, and the time change of T indicates the situation. Next, when shifted to the power saving mode at time=time2, as the main circuits are stopped and the power consumption is reduced, the internal temperature gradually decreases. The degree of the temperature change at the time is controlled by the size of the thermal resistance RTRX with the outside of the optical transceiver 1 and the thermal capacity CTRX of the inside. The smaller the value of 1/(RTRX·CTRX) is, the slower the time change of the internal temperature becomes. In the power saving mode after the operating mode, the internal temperature is estimated on the basis of the temperature detected by the thermal sensor 55, and the detail will be described next.

An estimation result of the internal temperature between the times time2 and time3 in FIG. 8 will be described using an example of a simulation of time response by a thermally equivalent circuit model.

Figure 9:
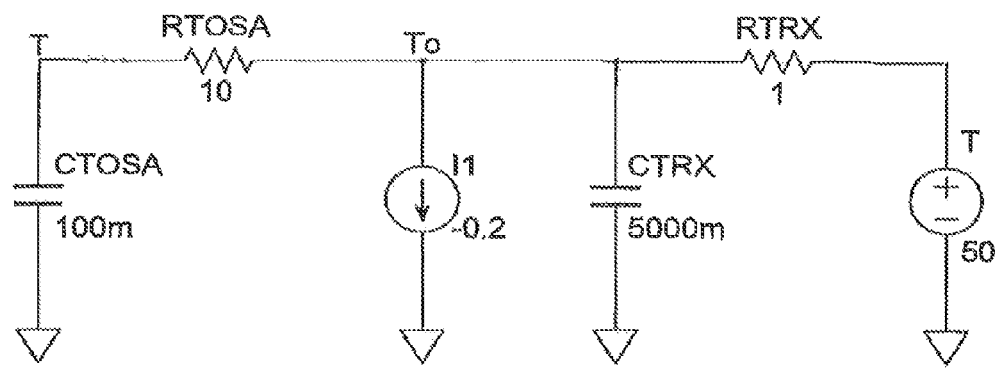
FIG. 9 is a diagram illustrating an equivalent circuit model for thermal analysis.

The thermally equivalent circuit model is for conducting thermal analysis using a method of electric circuit analysis by replacing a temperature in the thermal analysis with a voltage in the electric circuit analysis, the thermal resistance with electric resistance, the thermal capacity with a capacitor, and thermal flow with a current, and equivalently handling physical quantities before and after replacement. Specifically, transient analysis was conducted using a circuit simulator by an electric circuit illustrated in FIG. 9. For initial conditions, since the count-up timer (time t) is reset at the time=time2 in FIG. 8, the time was defined as t=0, and T(0)=40° C. and $T_0$(0)=70° C. were attained. Also, RTOSA*CTOSA=1, and RTRX*CTRX=5 were attained. Therefore, the above-described formula (9) is satisfied.

Figure 10A:
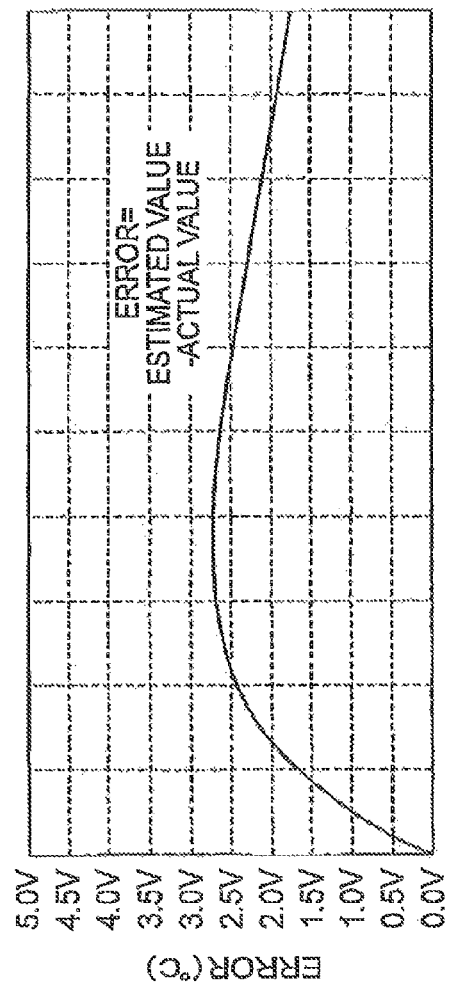
FIG. 10A is a diagram illustrating simulation results of FIG. 9.
Figure 10B:
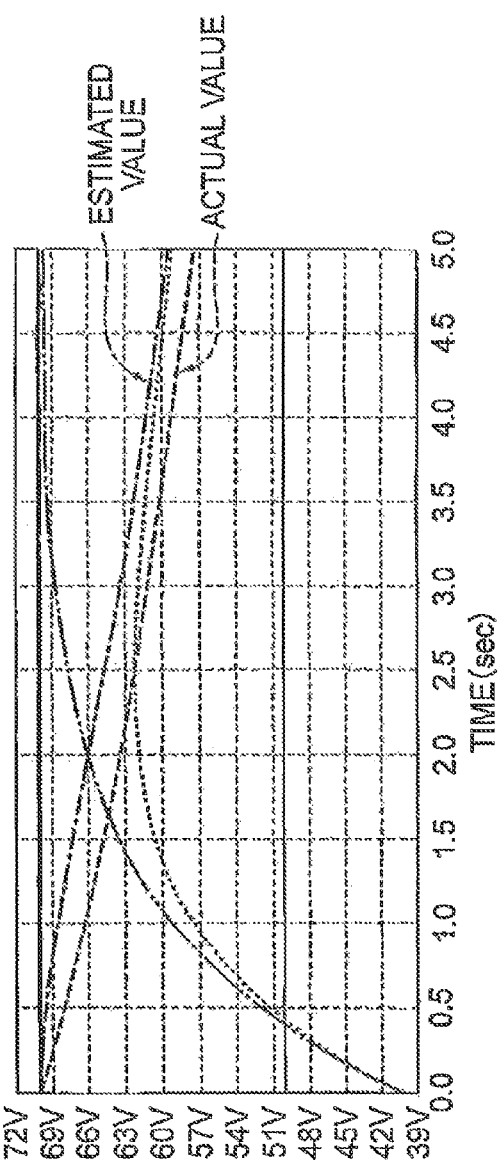
FIG. 10B is a diagram illustrating simulation results of FIG. 9.

Transient changes of the actual value of the internal temperature $T_0$ and the estimated value of the internal temperature $T_0$ using the above-described formula (4) are close as illustrated in FIG. 10B, and the actual value can be excellently estimated by the embodiment. Specifically, an error (the estimated value−the actual value) becomes equal to or smaller than 5° C., and it can be a sufficiently practical level.

The preferred embodiment according to the present invention has been illustrated and described above, however, the present invention is not limited to the above-described specific embodiment. That is, it is easily recognized by those skilled in the art that various modifications and alterations are possible within the scope of the gist of the present invention described in the scope of claims.

What is claimed is:

1. An optical transmitter having a function of answering an internal temperature to an external device, comprising:
    an optical transmitter module including at least one active element configured to generate heat by energization, a thermoelectric element configured to heat or cool the active element, a thermal sensor configured to sense a temperature of the active element, and a package configured to house the active element, the thermal sensor, and the thermoelectric element, the active element being thermally coupled with an outside of the package through a plurality of electric wires connected with a plurality of terminals of the package;
    an arithmetic processing circuit configured to control the energization of the active element;
    a storage device configured to store data, the data being accessible from the arithmetic processing circuit; and
    a temperature detection circuit configured to detect the internal temperature and output data of the internal temperature,
    wherein the arithmetic processing circuit stores the data output from the temperature detection circuit to the storage device as the internal temperature when the active element is being energized, and calculates data of the internal temperature based on the basis of both the temperature detected with the thermal sensor and the data stored in the storage device, and stores the calculated data to the storage device as the internal temperature when the active element is not being energized.

2. The optical transmitter according to claim 1, wherein, when thermal resistance between the active element and the temperature detection circuit is defined as RTOSA, thermal resistance between the temperature detection circuit and an outer side surface of the optical transmitter is defined as RTRX, thermal capacity to be heated and cooled by the thermoelectric element is defined as CTOSA, and thermal capacity inside the optical transmitter is defined as CTRX,

[formula 1]

$$\frac{1}{RTOSA \times CTOSA} > \frac{1}{RTRX \times CTRX} \quad (1)$$

is satisfied.

3. The optical transmitter according to claim 2, wherein the optical transmitter module includes at least two light emitting elements and at least one drive circuit configured to drive the light emitting elements, as the active elements, and
wherein the light emitting elements and the drive circuit are thermally coupled with the outside of the package through the plurality of electric wires connected with the plurality of terminals of the package, respectively.

4. The optical transmitter according to claim 3, wherein the thermal sensor is electrically connected with the arithmetic processing circuit, and
wherein the arithmetic processing circuit, when calculating the data of the internal temperature on the basis of the temperature detected with the thermal sensor when the active elements are not being energized, utilizes the temperature detected by the temperature detection circuit immediately before stopping the energization of the active elements.

5. The optical transmitter according to claim 4, wherein the active elements are powered by an internal power supply, and the active elements are being energized when the arithmetic processing circuit runs the internal power supply, and the active elements are not being energized when the arithmetic processing circuit stops the internal power supply.

6. The optical transmitter according to claim 5, wherein the internal power supply is run by the arithmetic processing circuit when the optical transmitter operates at an operating mode,
the internal power supply is stopped by the arithmetic processing circuit when the optical transmitter operates at a power saving mode, and
whether the optical transmitter operates at the operating mode or at the power saving mode is determined based on an instruction signal.

7. The optical transmitter according to claim 6, wherein the arithmetic processing circuit receives the instruction signal from the external device through a communication bus.

8. The optical transmitter according to claim 1, wherein the optical transmitter module includes at least two light emitting elements and at least one drive circuit configured to drive the light emitting elements, as the active elements, and
wherein the light emitting elements and the drive circuit are thermally coupled with the outside of the package through the plurality of electric wires connected with the plurality of terminals of the package, respectively.

9. The optical transmitter according to claim 8, wherein the thermal sensor is electrically connected with the arithmetic processing circuit, and
wherein the arithmetic processing circuit, when calculating the data of the internal temperature on the basis of the temperature detected by the thermal sensor when the active elements are not being energized, utilizes the temperature detected by the temperature detection circuit immediately before stopping the energization of the active elements.

10. The optical transmitter according to claim 9, wherein the temperature detection circuit and the arithmetic processing circuit are connected through a serial communication bus, and the arithmetic processing circuit receives data of the internal temperature from the temperature detection circuit through the serial communication bus when the optical transmitter operates at an operating mode.

11. The optical transmitter according to claim 10, wherein the active elements are powered by an internal power supply, and the active elements are being energized when the arithmetic processing circuit runs the internal power supply, and the active elements are not being energized when the arithmetic processing circuit stops the internal power supply.

12. The optical transmitter according to claim 11, wherein the internal power supply is run by the arithmetic processing circuit when the optical transmitter operates at the operation mode,
the internal power supply is stopped by the arithmetic processing circuit when the optical transmitter operates at a power saving mode, and
whether the optical transmitter operates at the operating mode or at the power saving mode is selected based on an instruction signal.

13. The optical transmitter according to claim 12, wherein the arithmetic processing circuit receives the instruction signal from the external device through a communication bus.

14. The optical transmitter according to claim 1, wherein the thermal sensor is electrically connected with the arithmetic processing circuit, and
wherein the arithmetic processing circuit, when calculating the data of the internal temperature on the basis of the temperature detected by the thermal sensor when the active element is not being energized, utilizes the temperature detected by the temperature detection circuit immediately before stopping the energization of the active element.

15. The optical transmitter according to claim 14, wherein the active element is powered by an internal power supply, and the active element is being energized when the arithmetic processing circuit runs the internal power supply, and the active element is not being energized when the arithmetic processing circuit stops the internal power supply.

16. The optical transmitter according to claim 15, wherein the internal power supply is run by the arithmetic processing circuit when the optical transmitter operates at an operating mode,
the internal power supply is stopped by the arithmetic processing circuit when the optical transmitter operates at a power saving mode, and whether the optical transmitter operates at the operating mode or the power saving mode is selected based on an instruction signal.

17. The optical transmitter according to claim 16, wherein the arithmetic processing circuit receives the instruction signal from the external device through a communication bus.

\* \* \* \* \*